US008934597B2

(12) United States Patent
Jacob et al.

(10) Patent No.: US 8,934,597 B2
(45) Date of Patent: Jan. 13, 2015

(54) MULTIPLE DELAY LOCKED LOOP INTEGRATION SYSTEM AND METHOD

(75) Inventors: Stefan Jacob, Santa Clara, CA (US); Martin Peisl, San Jose, CA (US); Harald Zweck, Munich (DE)

(73) Assignee: Infineon Technologies AG, Neubiberg (DE)

( * ) Notice: Subject to any disclaimer, the term of this patent is extended or adjusted under 35 U.S.C. 154(b) by 1507 days.

(21) Appl. No.: 10/386,974

(22) Filed: Mar. 12, 2003

(65) Prior Publication Data

US 2004/0179640 A1   Sep. 16, 2004

(51) Int. Cl.
| | | |
|---|---|---|
| H04L 7/00 | (2006.01) | |
| H03L 7/081 | (2006.01) | |
| H03L 7/087 | (2006.01) | |
| H03L 7/10 | (2006.01) | |

(52) U.S. Cl.
CPC ............. *H03L 7/0812* (2013.01); *H03L 7/087* (2013.01); *H03L 7/10* (2013.01)
USPC ....................................................... 375/371

(58) Field of Classification Search
CPC ... H03L 7/0812; H03L 7/0814; H03L 7/0802; H03L 7/087; H03L 7/18; H03L 2207/50; H03L 7/10; G06F 1/324; G06F 1/3203; G06F 1/12; H03K 2005/00019; H04L 7/0337; Y02B 70/16; H03M 1/502; H04B 1/7085
USPC .......... 375/354, 355, 371–376; 327/141, 155, 327/156–159
See application file for complete search history.

(56) References Cited

U.S. PATENT DOCUMENTS

| | | | | |
|---|---|---|---|---|
| 5,389,898 A | * | 2/1995 | Taketoshi et al. | 331/2 |
| 5,686,864 A | * | 11/1997 | Martin et al. | 331/1 A |
| 5,710,720 A | * | 1/1998 | Algrain et al. | 700/280 |
| 5,796,673 A | * | 8/1998 | Foss et al. | 365/233 |
| 5,880,612 A | | 3/1999 | Kim | 327/158 |
| 5,955,904 A | * | 9/1999 | Kawasaki | 327/156 |
| 6,008,680 A | | 12/1999 | Kyles et al. | 327/277 |
| 6,100,735 A | | 8/2000 | Lu | 327/158 |
| 6,150,886 A | * | 11/2000 | Shimomura | 331/2 |
| 6,211,740 B1 | | 4/2001 | Dai et al. | |
| 6,218,877 B1 | | 4/2001 | Oyama et al. | 327/158 |

(Continued)

OTHER PUBLICATIONS

Se Jun Kim, et al.; "A Low-Jitter Wide-Range Skew-Calibrated Dual-Loop DLL Using Antifuse Circuitry for High-Speed DRAM"; IEEE Journal of Solid-State Circuits, vol. 37, No. 6, Jun. 2002, pp. 726-734.

*Primary Examiner* — Vineeta Panwalkar
(74) *Attorney, Agent, or Firm* — John S. Economou

(57) ABSTRACT

A delay locked loop (DLL) circuit having an expanded operating frequency range is achieved by providing multiple DLLs, each having a different range of operating frequencies. A selection mechanism selects the DLL with the appropriate operating frequency range. The output of the selected DLL is used as the output of the delay locked loop circuit and is fed back to the input of the selected DLL so as to achieve phase lock with an input signal. The selection mechanism can operate in accordance with, among other things, a metallization mask option, the state of one or more pins, the state of one or more bits of a software accessible register or storage device, or the output of a frequency detector which detects the frequency of the input clock signal. The selection mechanism can also cause the selected DLL to be activated and the unselected DLL(s) to be deactivated, thereby conserving power.

19 Claims, 2 Drawing Sheets

(56) References Cited

U.S. PATENT DOCUMENTS

| | | | |
|---|---|---|---|
| 6,285,225 B1 | 9/2001 | Chu et al. | 327/158 |
| 6,326,826 B1 | 12/2001 | Lee et al. | 327/161 |
| 6,377,092 B2 | 4/2002 | Ikeda | 327/158 |
| 6,392,458 B1 | 5/2002 | Miller, Jr. et al. | 327/158 |
| 6,396,322 B1 | 5/2002 | Kim et al. | 327/158 |
| 6,469,555 B1 | 10/2002 | Lau et al. | 327/158 |
| 6,798,266 B1 * | 9/2004 | Chang et al. | 327/291 |
| 6,914,852 B2 * | 7/2005 | Choi | 365/233 |
| 2003/0071668 A1 * | 4/2003 | Starr | 327/157 |
| 2003/0081709 A1 * | 5/2003 | Ngo et al. | 375/362 |
| 2003/0085744 A1 * | 5/2003 | Heo et al. | 327/158 |
| 2004/0066219 A1 * | 4/2004 | Burgess | 327/156 |
| 2004/0202264 A1 * | 10/2004 | Choi | 375/354 |
| 2004/0225907 A1 * | 11/2004 | Jain et al. | 713/320 |
| 2007/0168676 A1 * | 7/2007 | Fayad et al. | 713/185 |

* cited by examiner

US 8,934,597 B2

MULTIPLE DELAY LOCKED LOOP INTEGRATION SYSTEM AND METHOD

FIELD OF THE INVENTION

The present invention relates to delay locked loop (DLL) circuits, particularly to DLL circuits with an extended range of operating frequencies.

BACKGROUND OF THE INVENTION

High speed electronic systems often have critical timing requirements which call for a periodic clock signal having a precise timing relationship with some reference signal. The improved performance of integrated circuits (ICs) and their ever-increasing complexity presents a challenge with respect to keeping such ICs synchronized when inter-operating in ever more complex systems.

For best performance, the operation of all components in a system should be highly synchronized, i.e., the maximum skew or difference in time between the significant edges of the internal clocking signals of all the components should be minimal. Because different components may have different manufacturing parameters which when taken together with additional factors, such as ambient temperature, voltage, and processing variations, could lead to large differences in the phases of the internal clocking signals of the different components, simply feeding a system-wide reference clock to the components may not be sufficient to achieve synchronization.

One way synchronization has been achieved is with the use of a delay locked loop (DLL). Various analog as well as digital implementations of DLLs are known. FIG. 1 is a block diagram of a typical DLL. The DLL includes a phase detector 10 which detects the phase difference between an input clock signal and an output clock signal of the same frequency and generates a signal related to the phase difference. The phase difference signal is in turn used by a delay control block 20 to control a variable delay chain 30 which accordingly advances or delays the timing of the output clock signal with respect to the input clock signal until the rising edge of the output clock signal is coincident with the rising edge of the input clock signal. The phase detector 10, control block 20 and delay chain 30 thus operate in a closed loop to bring the two clock signals into phase and thus synchronize the components whose operations are timed in accordance with the respective clock signals.

The range of frequencies of the input clock signal over which a particular DLL circuit can operate is typically limited. The primary factors which typically limit the operating frequency range of a DLL are the complexity of the large transistor chains and the long lock-in periods that are required for large frequency ranges. The range of clocking frequencies over which a computing device such as a dynamic random access memory (DRAM), can operate is often limited by the operating frequency range of the DLL of the DRAM.

SUMMARY OF THE INVENTION

The limited operating frequency range of conventional DLLs is overcome by the present invention by combining two or more DLLs of different frequency ranges. In an exemplary embodiment, a circuit is provided with multiple DLLs, each DLL having a frequency range different from the other DLLs. A selection mechanism is provided so as to select the DLL that is best suited for a given application based on the desired operating frequency of the circuit. The selection mechanism may entail, among other things, one or more of a mask option, pin input detection, input clock frequency detection, storage device (e.g., register) contents detection, or any suitable circuit operating state detection.

BRIEF DESCRIPTION OF THE DRAWINGS

The foregoing and other features of the present invention will be more readily apparent from the following detailed description and drawings of illustrative embodiments of the invention, in which.

DETAILED DESCRIPTION

Figure 2:
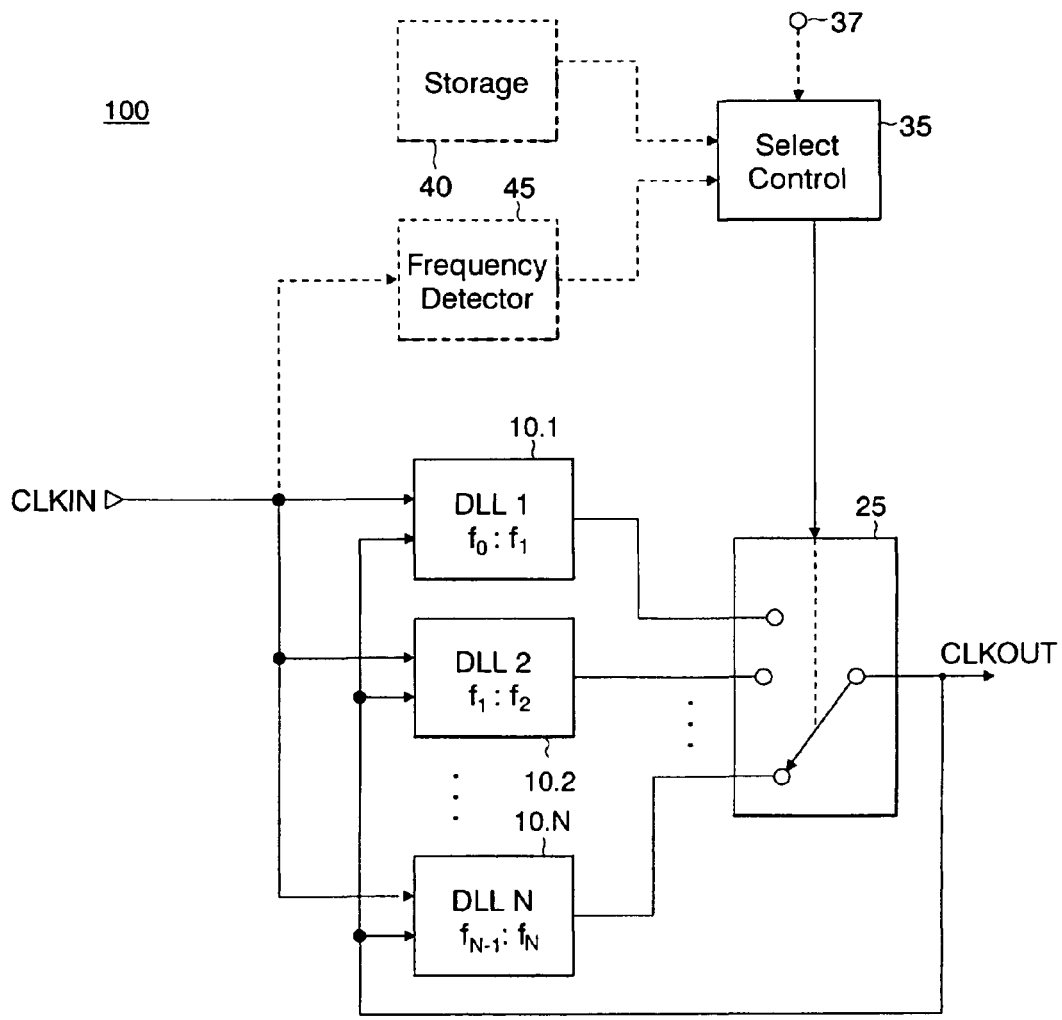
FIG. 2 is a block diagram of an exemplary embodiment of a DLL circuit having an expanded operating frequency range, in accordance with the present invention.

FIG. 2 shows an exemplary embodiment of a delay locked loop (DLL) circuit 100 in accordance with the present invention. The circuit 100 would likely be implemented as part of an integrated circuit (IC), such as a processor or memory device, but may also be implemented as a discrete circuit.

Figure 1:
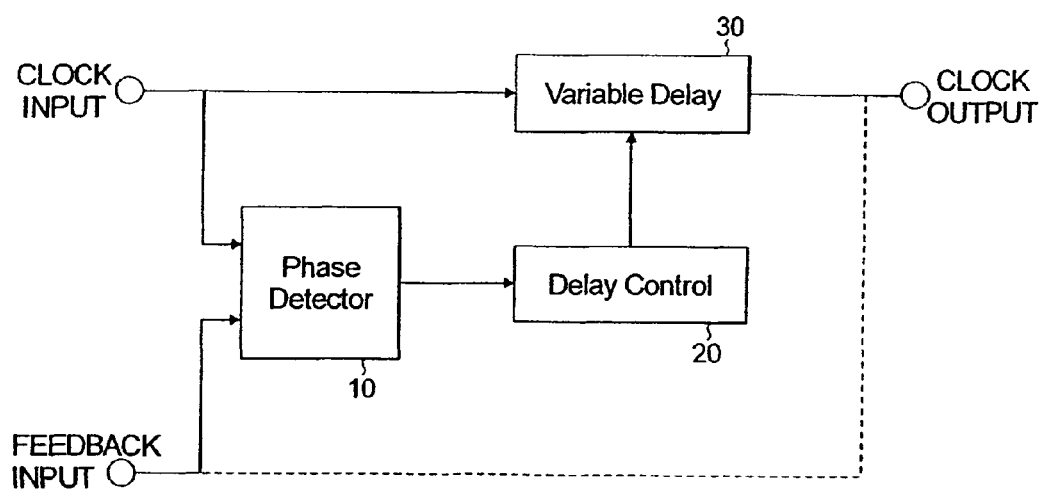
FIG. 1 is a block diagram of a typical delay locked loop.

The circuit 100 comprises two or more DLLs 15.1-15.N. Each DLL has an operating frequency range which is different than that of any of the other DLLs. The operating frequency ranges of two or more DLLs may or may not overlap. The operating frequency ranges may be selected in accordance with the requirements of the particular applications in which the circuit is to operate. The DLLs 15.1-15.N may be implemented as shown in FIG. 1.

An input clock signal, CLKIN, is provided to each of the DLLs 15.1-15.N. The output of each DLL is coupled to a selector 25. Under the control of a selection control mechanism 35, the selector 25 selects the output of one of the DLLs and outputs that as an output clock signal, CLKOUT. The output clock signal CLKOUT is fed back to each of the DLLs 15.1-15.N for phase comparison against the input clock signal CLKIN. When the output of a DLL 15.1-15.N is selected, a closed loop is thus created by the feeding back of the output clock signal CLKOUT to the feedback input of the DLL. (See FIG. 1.) CLKOUT is thus brought into phase with CLKIN by the operation of the selected DLL in the feedback loop.

By including the selector 25 in the feedback loop, as shown in FIG. 2, any delay introduced by the selector is compensated for by the operation of the selected DLL. If this delay is negligible or can be compensated for by other means, it is also possible, in an alternative embodiment, to feedback the output of each DLL 15.1-15.N to its respective phase comparator 10, internally to the DLL (i.e., via the dotted path shown in FIG. 1.) In this embodiment, the provision of CLKOUT to the feedback inputs of the DLLs 15.1-15.N (as shown in FIG. 2) is not necessary.

As can be understood by a person of ordinary skill in the art, the selector 25 can be implemented in a variety of known ways, using for example, logic gates, drivers whose outputs can be put into a high impedance state, analog switches, etc.

The selection control block 35 can also be implemented in a variety of ways and can operate on the basis of various conditions and states. For example, the selection control mechanism 35 can be implemented with a mask option for the metallization layer of the IC in which the DLL circuit 100 is implemented. In this case, when the metallization layer is applied, the selector 25 can be hardwired to select one of the DLLs 15.1-15.N depending on the desired operating frequency range of the IC. As such, ICs with different operating frequency ranges can be implemented using the same underlying semiconductor structure.

In another exemplary embodiment, the selection control block 35 can operate in accordance with the state of one or more pins 37 of the IC on which the DLL circuit is implemented. The state of these pins can be hardwired or controlled by other circuitry.

In yet another exemplary embodiment, the selection control block 35 can operate in accordance with one or more bits of a register, memory location or any suitable storage device 40 whose states can be controlled by software. Thus, for example, if a system goes into a boot-up or low-power state in which its operating frequency is reduced, the DLL circuitry 100 can be controlled to select the appropriate DLL for the desired operating frequency.

The selection control block 35 can also operate in accordance with the output of a frequency detection circuit 45. The frequency detection circuit can determine the frequency of the input clock signal CLKIN and cause the selector 25 to select the appropriate DLL for the frequency detected.

Other parameters, conditions and devices for controlling the selection of DLLs can be envisioned within the scope of the present invention and are not limited to those described herein.

In addition to controlling the selection of the DLL outputs by the selector 25, the selection control mechanism 35 can also control the activation (energization, powering, etc.) of the DLLs 15.1-15.N so that only the DLL whose output is selected by the selector 25 is activated (energized, powered, etc.) This feature can help reduce the power consumption of the DLL circuit.

The present invention is not to be limited in scope by the specific embodiments described herein. Indeed, various modifications of the invention in addition to those described herein will become apparent to those skilled in the art from the foregoing description and the accompanying figures. Such modifications are intended to fall within the scope of the appended claims.

It is further to be understood that all values are to some degree approximate, and are provided for purposes of description.

The disclosures of any patents, patent applications, and publications that may be cited throughout this application are incorporated herein by reference in their entireties.

What is claimed is:

1. A delay locked loop circuit for a system having two modes of operation, comprising:
   a first delay locked loop having a first operating frequency range, the first operating frequency range selected for a first of the two modes of operation;
   a second delay locked loop having a second operating frequency range, the second operating frequency range selected for a second of the two modes of operation; and
   a selector configured to dynamically select for output and power only one of the first and second delay locked loops, wherein the first and second frequency ranges are different, wherein the first delay locked loop is selected for the first mode of operation and the second delay lock loop is selected for the second mode of operation.

2. The circuit of claim 1, wherein:
   the first delay locked loop comprises an input coupled to an input signal and an output coupled to the selector;
   the second delay locked loop comprises an input coupled to the input signal and an output coupled to the selector; and
   the selector generates an output signal in accordance with the output of the selected delay locked loop.

3. The circuit of claim 2, wherein:
   the output signal is coupled to a further input of the first delay locked loop; and
   the output signal is coupled to a further input of the second delay locked loop.

4. The circuit of claim 1, wherein the selector selects a delay locked loop in accordance with the contents of a register.

5. The circuit of claim 1, wherein the selector selects a delay locked loop in accordance with the state of one or more signals.

6. The circuit of claim 1, wherein the delay locked loop which is not selected is not activated.

7. The circuit of claim 1, wherein the first and second frequency ranges do not overlap.

8. The circuit of claim 1 comprising a storage device, wherein the selector selects the one delay locked loop in accordance with the contents of the storage device.

9. The circuit of claim 1 comprising a frequency detector, wherein the selector selects the one delay locked loop in accordance with an output of the frequency detector.

10. An integrated circuit comprising the circuit of claim 1.

11. The integrated circuit of claim 10 comprising one or more selection inputs, wherein the selector selects the one delay locked loop in accordance with a state of the one or more selection inputs.

12. The circuit of claim 1, wherein the selected delay locked loop is activated and the other delay locked loop is deactivated.

13. The circuit of claim 1, wherein the selector is configured to select only one of the first and second delay locked loops by selectively coupling an output of the first delay lock loop or the second delay lock loop as an output.

14. The circuit of claim 13, wherein the selector is configured to power only one of the first and second delay locked loops by selectively providing power to one of the first delay lock loop and the second delay lock loop while not providing power to the other of the first delay lock loop and the second delay lock loop.

15. A computing device comprising the circuit of claim 1.

16. The computing device of claim 15, wherein the computing device is a memory device.

17. A delay locked loop circuit for a system having two modes of operation, comprising:
    a first delay locked loop having a first operating frequency range, the first operating frequency range selected for a first of the two modes of operation;
    a second delay locked loop having a second operating frequency range, the second operating frequency range selected for a second of the two modes of operation; and
    a selector configured to dynamically select for output and energize only one of the first and second delay locked loops, wherein the first and second frequency ranges are different, wherein the first delay locked loop is selected for the first mode of operation and the second delay lock loop is selected for the second mode of operation.

18. The circuit of claim 17, wherein the selector is configured to select only one of the first and second delay locked loops by selectively coupling an output of the first delay lock loop or the second delay lock loop as an output.

19. The circuit of claim 18, wherein the selector is configured to energize only one of the first and second delay locked loops by selectively providing energy to one of the first delay lock loop and the second delay lock loop while not providing energy to the other of the first delay lock loop and the second delay lock loop.

* * * * *